United States Patent [19]

Pizzigoni

[11] 3,867,672

[45] Feb. 18, 1975

[54] INTEGRATED CIRCUIT BREADBOARD MODULE

[75] Inventor: Alfred Pizzigoni, North Bergen, N.J.

[73] Assignee: Stephen Horbach and Company, Lyndhurst, N.J.

[22] Filed: Aug. 9, 1973

[21] Appl. No.: 386,978

[52] U.S. Cl.... 317/101 CC, 317/101 DH, 339/17 C

[51] Int. Cl. .............................................. H05k 5/00

[58] Field of Search............... 317/101 CC, 101 DH; 339/17 CP, 17 C; 174/DIG. 3; 35/19 A; 324/158 F

[56] References Cited

UNITED STATES PATENTS

| | | | |
|---|---|---|---|
| 3,085,177 | 4/1963 | Thompson | 317/101 CC |
| 3,631,299 | 12/1971 | Meyer | 317/101 DH |
| 3,668,476 | 6/1972 | Wrabel et al. | 317/101 DH |

OTHER PUBLICATIONS

"High Density Dual-In-Line Packaging Panels," AUGAT Catalogue from Electronic Design, August 1967, Vol. 15, No. 16.

*Primary Examiner*—David Smith, Jr.
*Attorney, Agent, or Firm*—Kenyon & Kenyon Reilly Carr & Chapin

[57] ABSTRACT

An improved breadboard module for constructing breadboards of integrated circuits which includes a printed circuit enclosed within a plastic case with an integrated circuit socket attached to the printed circuit board. Each of the leads from the socket is connected via the printed circuit to a multiple section clip terminal which projects from the case and may be used for interconnecting discreet components to and between the various circuit leads.

7 Claims, 10 Drawing Figures

INTEGRATED CIRCUIT BREADBOARD MODULE

BACKGROUND OF THE INVENTION

This invention relates to breadboard fixtures in general and more particularly to improved integrated circuit breadboard module.

Various types of breadboard devices have been used in setting up new circuits of the type which comprise integrated circuits and discrete components. In general most of these have used perforated boards to which an integrated circuit or integrated circuit socket could be mounted along with the required terminals. Wiring was generally done by running hard wires between the integrated socket and the various terminals mounted on the board. In many cases such prior art breadboard units did not adequately take into consideration the final dimensions of the circuit and the distributive stray capacative and inductive pickup associated therewith. In addition the construction of a breadboard of this nature is time consuming generally requiring placement of terminals on the board and soldering in place of all interconnections.

Thus there is a need for an improved breadboard module which can be used for breadboarding integrated circuits, particularly linear integrated circuits such as operational amplifiers, audio amplifiers, etc.

SUMMARY OF THE INVENTION

The present invention provides such an IC breadboard module which permits interconnecting with linear integrated circuits a plurality of external discrete components such as resistors, capacitors, transformers and inductors, along with signal input and output leads and power supply inputs, in such a manner that the breadboard design closely approximates the dimensions of the subsequent final design which will be developed therefrom. An integrated circuit socket for the type of integrated circuit to be tested is mounted to a printed circuit board which is enclosed in a plastic case in such a manner that the socket is accessible from the top. Each of the socket leads is electrically connected on the printed circuit board to a terminal clip comprising a spring loaded contact which will accomodate up to nine leads. Additional unconnected clips are also provided. Clips are secured to the printed circuit board and also project through the top of the plastic enclosure for easy access. To permit connecting leads of different diameters, each spring loaded terminal clip is divided into three sections. The unit is made extremely compact so that the breadboard layout can be arranged to very closely approximate the layout of the final circuit. Thus the distributive parameters such as capacitance and inductance will be the same in the breadboard as they are in the finished circuit allowing circuit performance to be accurately predicted. In the detailed description below, the module for use with a 14 lead inline integrated circuit will be described in detail along with an example of a printed circuit board for a 12 lead TO-5 circuit. It should be recognized that these are only examples and that 6, 8, and 10 lead integrated circuits may also be tested in similar modules having the appropriate sockets installed. Similarly 3 and 4 lead transistor sockets may be installed in a similar device.

DETAILED DESCRIPTION OF THE PREFERRED EMBODIMENT

Figure 1:
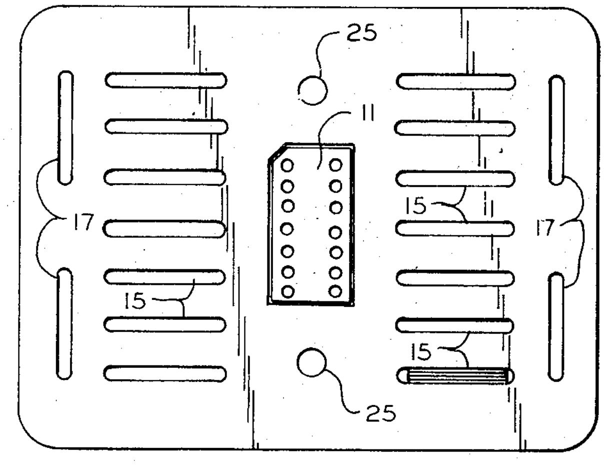
FIG. 1 is a plan view of a preferred embodiment of the present invention for use in breadboarding a dual-in-line integrated circuit.
Figure 2:
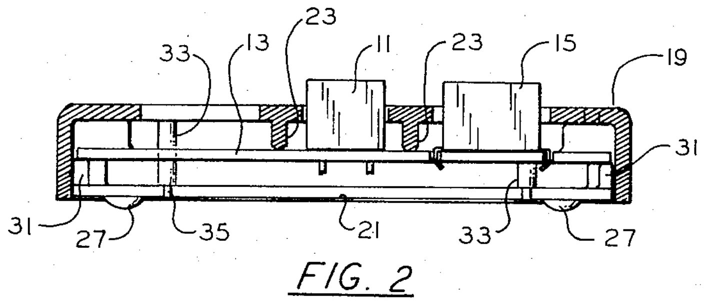
FIG. 2 is a cross sectional elevation view of the module of FIG. 1.
Figure 3:
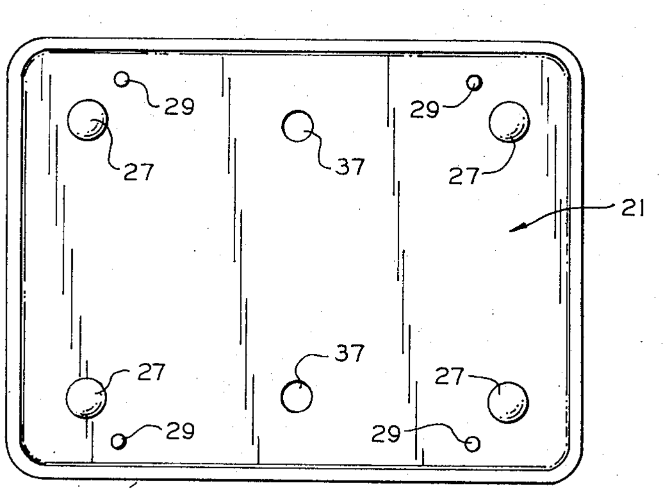
FIG. 3 is a bottom view of the module of FIG. 1.

The components which go to make up the module of the present invention are thus illustrated by FIGS. 1, 2, and 3. An integrated circuit socket 11, which is shown for a dual-in-line circuit is soldered to a printed circuit board 13, the layout of which will be described below in connection with FIG. 4. Also soldered to the printed circuit board are a plurality of spring loaded terminal clips 15, one being provided for each of the leads of the integrated circuit. Four identical terminal clips 17 are secured to the printed circuit but not electrically connected to the integrated circuit or any other terminal clips. The printed circuit board 13 is enclosed within a plastic case comprising a top section 19 and a bottom section 21. The top 19 is provided with appropriate holes so that the socket 11 and terminal clips 15 and 17 may project there through. A plurality of spacing ribs 23 are formed in the bottom of the top 19 to maintain the desired amount of projection of the socket 11 and terminal clips 15 through the top 19. Also formed in the top 19 are two holes 25 which are used for mounting components such as potentiometers as will be described below. The bottom piece 21 comprises an essentially flat member which has on its bottom four feet 27 on which the finished module rests on a table or bench. The bottom also contains four holes 29 which are used for securing it to the top section. On its inside it contains projections 31 used for spacing it from the printed circuit 11. Connection between the top section 19 and bottom 21 is made by four studs 33 formed on the inside of the top 19 projecting downward and having narrow cylindrical ends which fit through the holes 29 in the bottom. The narrowed ends 35 cause a shoulder to be formed which further aids in the spacing of the top and bottom. After projection through the holes 29, the ends are heat sealed to make an integral compact unit. The bottom 19 also contains two holes 37, aligned with the holes 25 in the top, similarly provided for mounting to chassis or bench in single unit or multiple units for test or circuit evaluation purposes.

Figure 4:
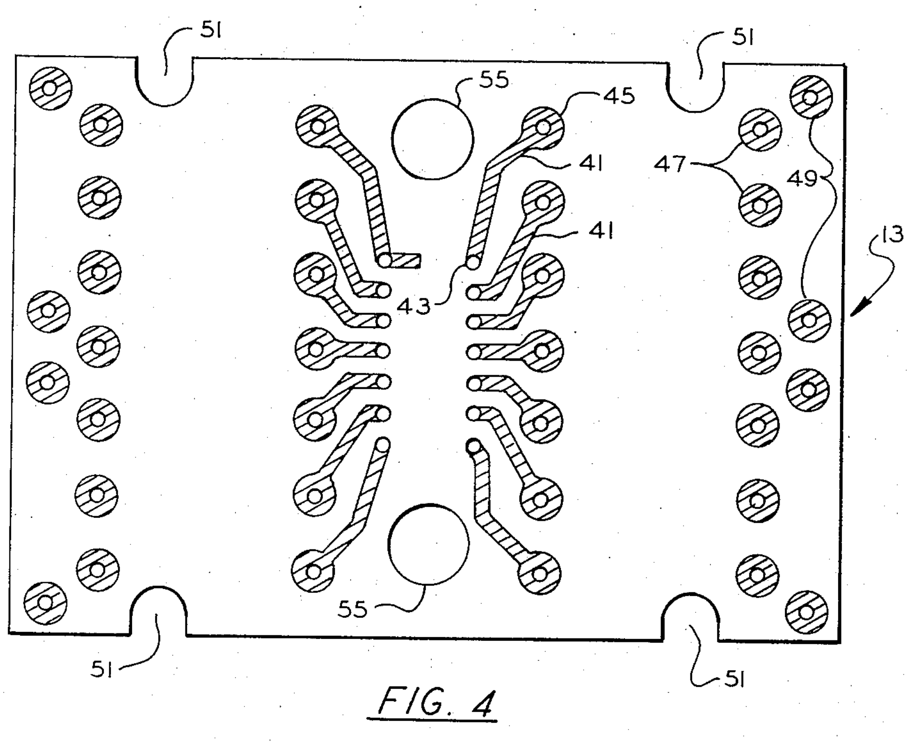
FIG. 4 is a plan view of the integrated circuit board used in the embodiment used in FIG. 1.

The integrated circuit board 13 is shown on FIG. 4. The printed circuit board 13 has a plurality of conducting sections 41 formed thereon in conventional fashion which at one end 43 terminate in connections having holes drilled therethrough for soldering of the IC socket thereto. The other end 45 terminates in a connection having a hole in its center through which the terminal clips 15 may be fastened and soldered in place. Similar annular connections for soldering the other ends of the terminal strips 15 and designated as 47 are shown. Also provided are four pairs of similar terminals for soldering in place of the terminal clips 17. The circuit board 13 has on two of its edges indentations 51 which are provided to allow the studs 33 to pass between the top 19 and the bottom 21 without interference from the circuit board 13.

Figure 5:
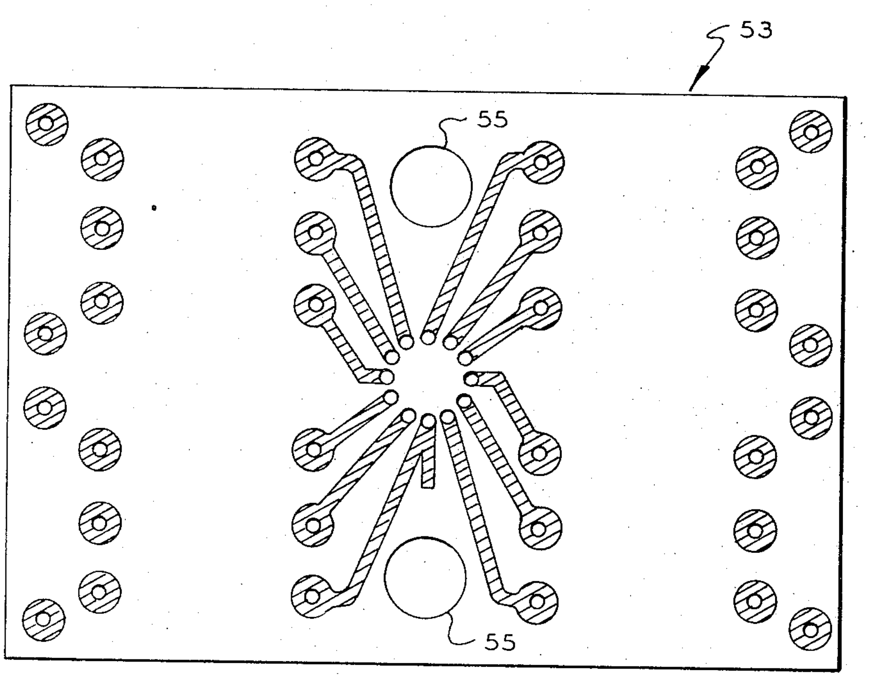
FIG. 5 is a plan view of a printed circuit board layout for an embodiment designed to accept a 12 lead TO-5 integrated circuit.

An alternate circuit board 53 designed to accept a 12 lead TO-5 can is shown on FIG. 5 and is of similar construction to the circuit board 13 described above. Each of the circuit boards contains a pair of holes 55 which are aligned with the holes 25 and 37 in the top and bottom respectively.

Figure 6:
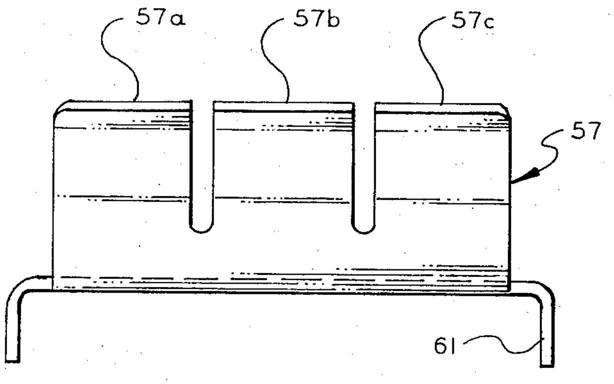
FIG. 6 is an elevation view of a terminal clip used in the embodiment in FIG. 1.
Figure 7:
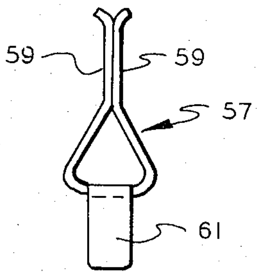
FIG. 7 is an end view of the terminal clip of FIG. 6.

An elevation view of one of the terminal clips is shown on FIGS. 6 and 7. As shown it comprises a spring tempered member 57 having an essentially triangular bottom section extending into two parallel portions 59 with the spring force holding the two sides 59 together. The top of the sides 59 project outward to form a diverging channel into which the lead of a component may be inserted. As shown on FIG. 6 the terminal clip 57 is divided up into three sections 57*a*, 57*b*, and 57*c*, each capable of holding up to three leads with the division providing the capability of the clip tightly holding leads of different axial size. Mounted to the bottom of the clip 57 running inside the triangular section is a connecting lead 61 having downward projections on each end to permit it to be inserted through the holes 45 and 47 or 49 on the printed circuit board 13 after which the leads are mechanically bent and soldered in place.

Figure 8:
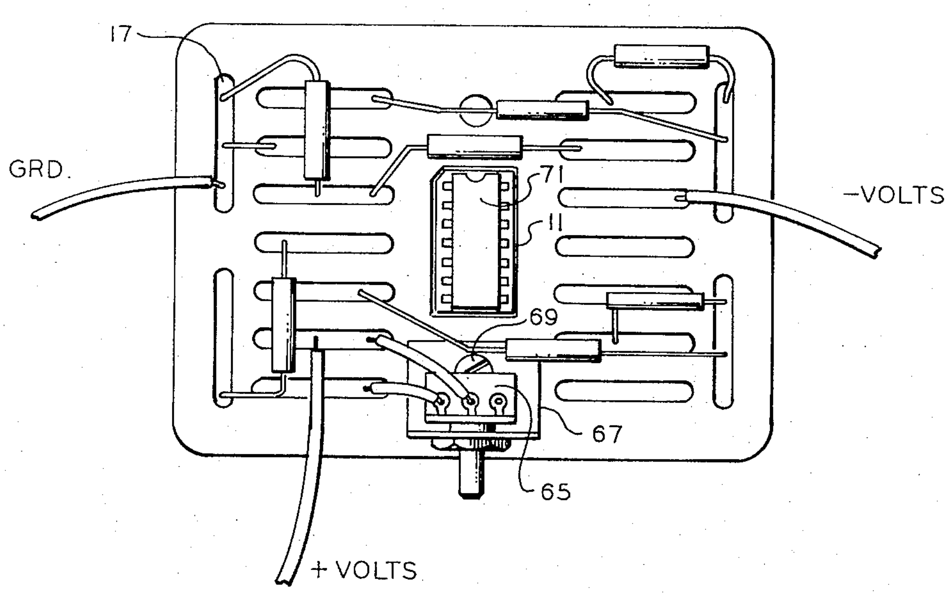
FIG. 8 is a plan view illustrating a typical breadboard circuit using the module of the present invention.

A typical breadboard circuit layout is illustrated by FIG. 8. Although in most respects this Figure is self-explanatory a few of its features will be pointed out. The manner in which a potentiometer 65 may be mounted to the breadboard module is illustrated. Potentiometer 65 is mounted to a bracket 67 in conventional fashion and the bracket 67 mounted to the module using a screw 69 which may be either a self-tapping screw sized to tap into the hole 25 of FIG. 1 or may be a screw extending through the hole 25, the hole 55 in the circuit board and the hole 37 in the bottom with a nut attached to its end. The Figures show the integrated circuit 71 mounted in the socket 11 along with a plurality of resistances and capacitances connected to the various terminals and interconnected with each other. Also shown is the input voltages of +6 and −6 volts and ground. The ground lead into one of the terminals 17 illustrates how this unconnected terminal may be effectively used. Since in most circuits a plurality of connections must be made to ground, terminals such as this become quite useful. The illustration of the module is enlarged to approximately twice its actual size. The actual circuit size is approximately 3⅛ inches in length, 2¼ inches in width and ½ inch in depth. Thus the breadboard arrangement can be conveniently transferred to a printed circuit board while maintaining essentially the same arrangement. Thus the distributed capacitances and inductances in the final circuit will very closely approximate those in the breadboard and actual circuit performance should not vary from that obtained with the breadboard.

In addition to being used for interconnection, the terminal clips also provide a convenient attachment point for the test leads of volt meters, ammeters, oscilloscopes, etc. when measuring circuit parameters during tests.

The materials used in the construction of the module are selected so as to be compatible with the highest operating frequency of the integrated circuits which will be used therein. As examples of materials, the top and bottom of the enclosing case may be made of natural methylpentene [TPX] available from Imperial Chemical Company, Herts England. The spring clips of pretinned 0.010 yellow brass, spring tempered alloy 260, QQ-B-613 Comp. 2. Circuit board materials may be XXXP phenolic, 1/16 inch thick, with 1 ounce copper cladding on one side.

Spacing between the terminal clips and the openings in the top of the module along with spacing of the clips from any components inside the module is selected so that soldering of components into the terminal clips will not damage the plastic housing.

Figure 10:
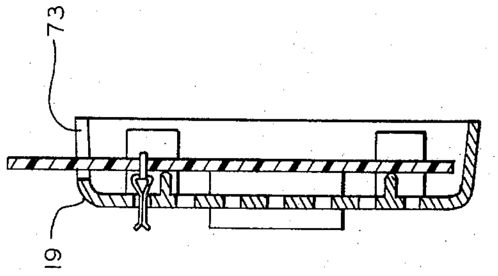
FIG. 10 is a cross sectional end view of the module of FIG. 9.
Figure 9:
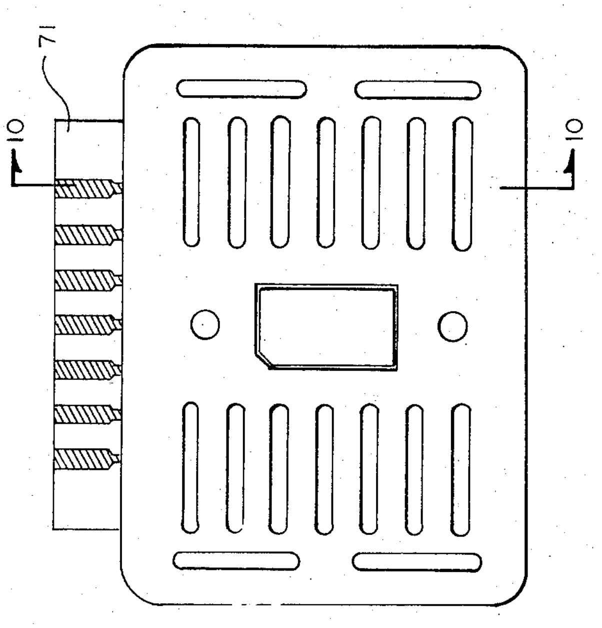
FIG. 9 is a plan view of an alternate embodiment of the present invention having an edge connector extending therefrom.

Since quite often it may be desirable to interconnect a plurality of breadboard circuits, an alternate embodiment of the invention which provides an edge connector which may be plugged into backplate wiring or the like is shown on FIGS. 9 and 10. Construction is identical of that described above except that the printed circuit board is made in a larger size with an edge connector 71 having leads thereon coupled to appropriate integrated circuit terminals or terminal clips. For example the positive, negative and ground leads would be provided on three edge connector terminals along with the input and output signal to the circuit. The top 19 is modified to have an open portion 73 on its one side to permit the extension of the printed circuit board out from the module.

In constructing the circuit, the leads of the various components as shown on FIG. 8 may be clipped in place or, if desired may be temporarily soldered in place. Thus, during initial breadboarding the leads may be simply clipped in place and once a final configuration is obtained more permanently soldered in place and the breadboard retained for use along with other breadboards which are being developed. The modules of the present invention, particularly when provided with the edge connector as shown on FIG. 9 are particularly useful in constructing large systems made up of circuits on a number of such modules. As noted above, the use of the module of the present invention provides a saving in time and money when constructing the breadboard since its use is much simpler than that of previously used breadboard devices, and because it may be reused indefinitely whereas with prior art breadboards it has generally been cheaper to discard them rather than to try to disassemble them for reuse.

Thus an improved integrated circuit breadboard module which provides advantages in cost, simplicity and accuracy has been shown. Although specific embodiments have been illustrated and described, it will be obvious to those skilled in the art that various modifications may be made without departing from the spirit of the invention which is intended to be limited soley by the appended claims.

What is claimed is:

1. An integrated breadboard assembly particularly useful for breadboarding linear integrated circuits comprising:

a. a printed circuit having a plurality of conductors thereon each adapted to accept one terminal of an integrated circuit at one end and a further connection at the other end;

b. an integrated circuit socket attached to said printed circuit board with terminals at said one ends of said conductors;

c. a terminal clip divided into three sections to permit acceptance of different size wires attached to each of the other ends of said conductors; and d. a solder-resistant plastic case enclosing said printed circuit board, socket and terminal clips, said case including openings in the top through which said socket and terminal clips project.

2. The invention according to claim 1 wherein said case is made of solder-resistant TPX plastic material.

3. The invention according to claim 1 wherein each of said terminal clips comprises:

a. a spring tempered member having an essentially triangular bottom section extending into two parallel portions with spring force holding the two parallel portions together, the top of the parallel portions projecting outward to form a divergent corner into which the lead of a terminal may be inserted, with said parallel portions divided into three sections; and b. means mounted to the bottom of said triangular bottom section in an electrically conductive manner running inside said section, said means having downward projections on each end inserted into holes in said printed circuit board, at least one of said holes being at one of said other ends of said conductors.

4. The invention according to claim 1 wherein said case comprises a top portion and a bottom portion and means holding said top and bottom portions together.

5. The invention according to claim 4 wherein said holding means comprise studs formed in the bottom of said top extending through holes in said bottom and heat sealed on the bottom of said bottom.

6. The invention according to claim 1 and further including additional terminal clips attached to said printed circuit board, said additional clips being electrically insulated from each other and said integrated circuit socket and associated terminal clips.

7. The invention according to claim 1 wherein said cover has an opening in one side and said printed circuit board is extended therethrough and further including additional conductors on said printed circuit board forming a male edge connection to mate with a female connector, said additional conductors leading to at least some of said integrated circuit socket terminals and said terminal clips.

* * * * *